United States Patent [19]
Allen

[11] Patent Number: 5,878,055
[45] Date of Patent: Mar. 2, 1999

[54] METHOD AND APPARATUS FOR VERIFYING A SINGLE PHASE CLOCKING SYSTEM INCLUDING TESTING FOR LATCH EARLY MODE

[75] Inventor: David Howard Allen, Rochester, Minn.

[73] Assignee: International Business Machines Corporation, Armonk, N.Y.

[21] Appl. No.: 987,702

[22] Filed: Dec. 9, 1997

[51] Int. Cl.[6] .................................................. G01R 31/28
[52] U.S. Cl. ...................................... 371/27.7; 371/22.36
[58] Field of Search ................................ 371/27.7, 22.31, 371/22.33, 22.36; 365/194; 364/934.3; 327/261, 276

[56] References Cited

U.S. PATENT DOCUMENTS

| | | | |
|---|---|---|---|
| 4,802,168 | 1/1989 | Yamanoi et al. | 371/27.1 |
| 5,175,447 | 12/1992 | Kawasaki et al. | 307/480 |
| 5,654,659 | 8/1997 | Asada | 327/208 |

*Primary Examiner*—Hoa T. Nguyen
*Attorney, Agent, or Firm*—Joan Pennington

[57] ABSTRACT

A method and apparatus are provided for efficiently verifying an on-chip single phase clocking system including testing for latch early mode. A variable delay clock circuit is provided for generating a plurality of delayed clock signals. A delay control register is selectively coupled to the variable delay clock circuit for controlling a delay value of each of the plurality of delayed clock signals. A scan control logic is coupled to the variable delay clock circuit for controlling an operational mode of the variable delay clock circuit. A plurality of latches having a clock input and a data input are coupled to the variable delay clock circuit. Each latch receives a respective one of the generated plurality of delayed clock signals and a data input signal is applied to the data input of a first one of the plurality of latches. The plurality of latches are connected in a chain with a respective latch output connected to a data input of a next latch and a last latch output of the plurality of latches provides an output data signal.

11 Claims, 9 Drawing Sheets

FIGURE1A
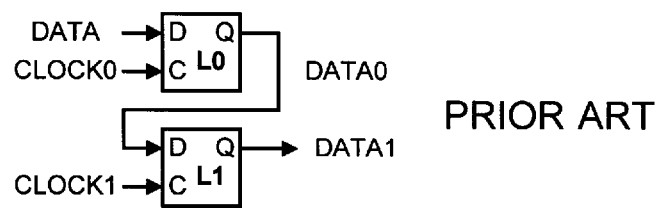
PRIOR ART
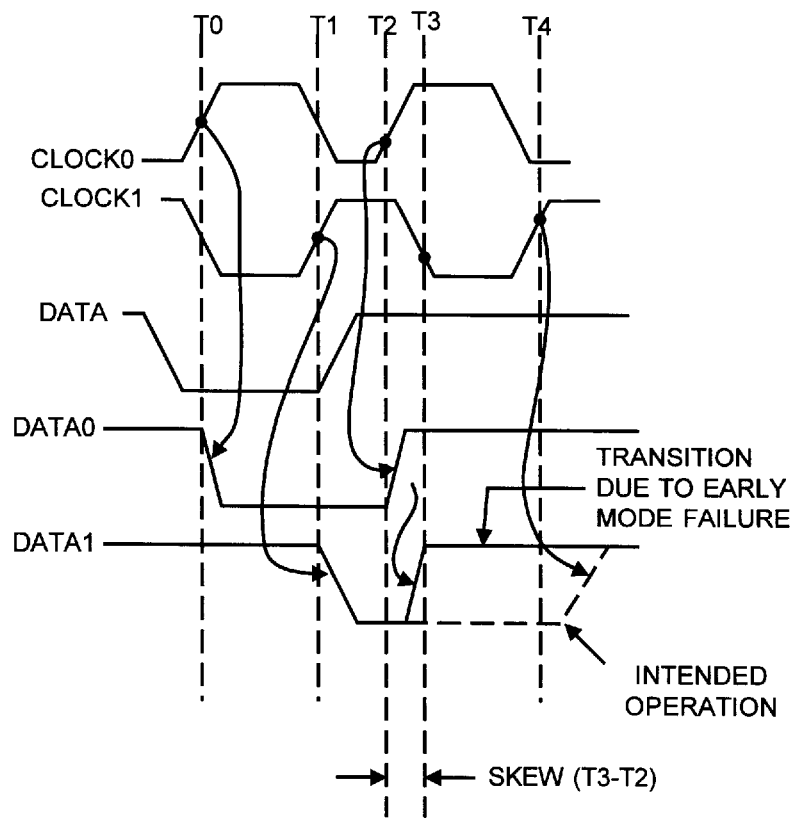
PRIOR ART
FIGURE1B

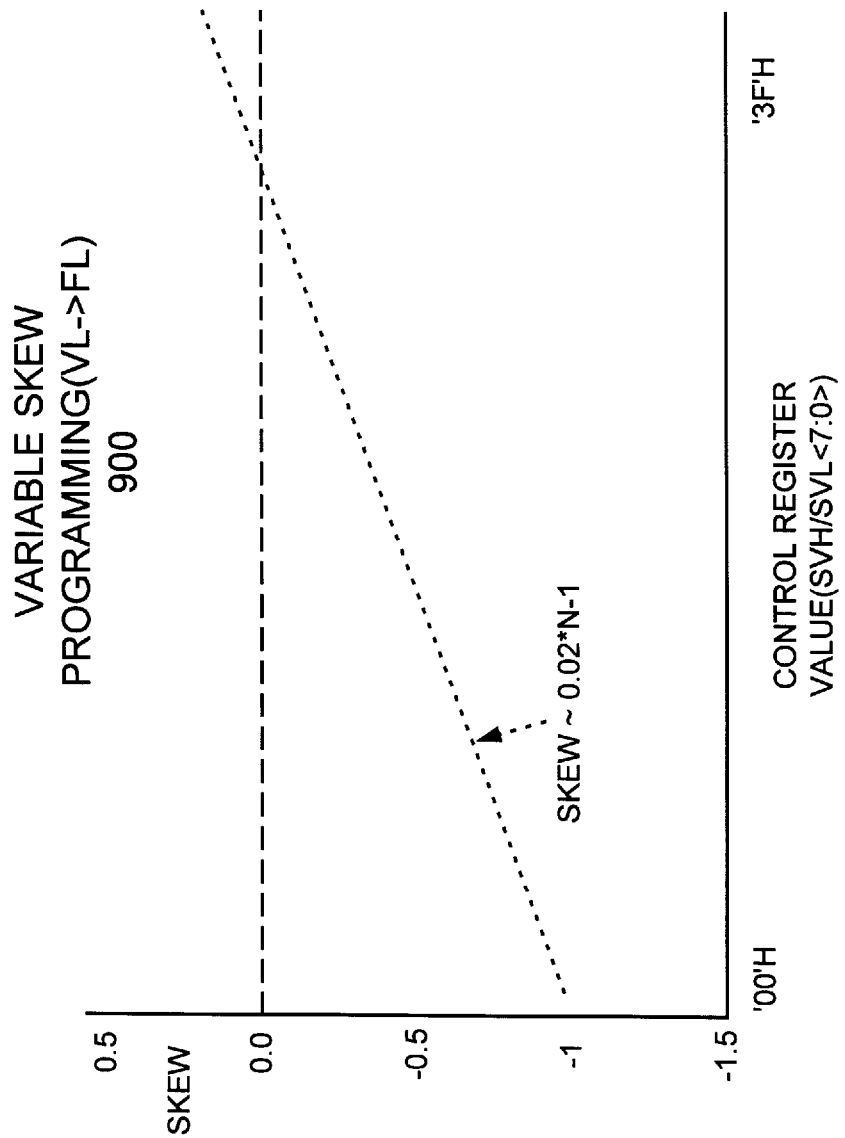

METHOD AND APPARATUS FOR VERIFYING A SINGLE PHASE CLOCKING SYSTEM INCLUDING TESTING FOR LATCH EARLY MODE

FIELD OF THE INVENTION

The present invention relates to a method and apparatus for efficiently verifying and testing an on-chip single phase clocking system including testing for latch early mode.

DESCRIPTION OF THE RELATED ART

Use of a single free-running clock, distributed across a processor or other very large scale integrated (VLSI) circuit chip on a metal grid offers several advantages over multiphase clocking schemes. A single phase clock reduces the uncertainty and variation in the arrival time of the clock at the latches or reduces clock skew, since only one clock is being distributed. Reducing clock skew not only aids performance since clock skew directly subtracts from the useful time available in a clock cycle, but helps prevent a condition called early mode. Early mode also is known as fast path problems and latch hold time violation.

Early mode occurs when the clock signal at a latch arrives significantly before a clock signal arriving at a latch which has as its data input, the output of a previous latch. In this case, the output of the first latch or source latch (L1 in FIG. 1A) can change before the second latch or sink latch (L0 in FIG. 1A) has time to capture the previous data, causing the sink latch to capture data a half-clock-cycle earlier than intended.

FIGS. 1A and 1B together illustrate early mode. Referring to FIG. 1A, assume L0 and L1 are both single phase latches. When CLOCK1 is high and CLOCK0 is low, latch L1 is transparent (Q follows D) and L0 is latched (Q stays at its current state regardless of D). When CLOCK1 is low and CLOCK0 is high, L1 is latched and L0 is transparent. The waveforms in FIG. 1B show two clock cycles. In the first clock cycle there is no separation between CLOCK0 and CLOCK1, both transition simultaneously at times T0 and T1. At time T0, CLOCK0 rises and L0 becomes transparent, causing the output signal DATA0 to go low (following the input data). At the same time, CLOCK1 falls and L1 latches data. At time T1, CLOCK1 rises and L1 becomes transparent, causing the output data 1 to go low (following the input DATA0). Between T1 and T2 the data input to L0 changes from a low to a high. At T2, CLOCK0 rises again which makes L0 transparent and its output DATA0 goes high (following data). However, at this point, CLOCK1 is delayed and does not go low until T3. The separation between CLOCK0 and CLOCK1 is the skew: SKEW32=T3-T2. Since L1 is still transparent between T2 and T3, and DATA0 has made a transition, DATA1 follows DATA0. This transition of DATA1 was not supposed to occur until after CLOCK1 goes high at T4, and represents a failure of the circuit to operate as intended. Note that in the first cycle only the clocks cause a DATA0 or DATA1 transition, while in the second cycle DATA1 transitions as a result of DATA0 making a transition; DATA1 changes early.

The amount of separation (SKEW32) required to cause an early mode failure is dependent on many variables, including the design of the latches, process parameters, environmental conditions including power supply and temperature, loading on DATA0 and possibly loading on DATA1, transition times of the data and clocks, and other factors. However complex it may be to determine, an accurate estimate of a tolerable amount of skew is of primary concern to the chip designer.

Early mode failures differ from late mode failures where the clock at the sink occurs earlier than the data is available, in that simply expanding the cycle time cannot correct the problem. Therefore, it is imperative that some method of preventing or correcting early mode problems is available to the chip designer.

Unfortunately, the simplicity of the single phase clocking scheme rules out the use of circuits which can be used to control the arrival time of the different edges of the clock. In the past, clock choppers and other schemes were used to delay various clock edges in order to reduce or eliminate early mode failures in the final design. Since a single phase clock system does not allow adjusting clock edges on-chip, it is imperative that the clock distribution is correct by construction and any possibility of early mode failures is eliminated in the base design. In a new design in a new technology, this can be difficult due to the large number of unknown quantities including process parameters and variation in circuit design, inductance effects, supply noise, and the like. Even after a design has been manufactured and characterized, early mode problems can appear if process parameters change. Since it is usually desirable to manufacture a product for the highest performance possible, very often process parameters are intentionally shifted or a design is migrated to a faster technology to create a faster product. This tends to aggravate early mode problems that might not have been a problem on a slower process. Failure to detect and screen product failing for early mode could lead to expensive and damaging failures in the field.

A need exists for a method and apparatus for efficiently verifying an on-chip single phase clocking system including testing for latch early mode.

SUMMARY OF THE INVENTION

Important objects of the present invention are to provide a method and apparatus for efficiently verifying an on-chip single phase clocking system including testing for latch early mode; to provide such method and apparatus substantially without negative effects and that overcome many disadvantages of prior art arrangements.

In brief, a method and apparatus are provided for efficiently verifying an on-chip single phase clocking system including testing for latch early mode. A variable delay clock circuit is provided for generating a plurality of delayed clock signals. A delay control register is selectively coupled to the variable delay clock circuit for controlling a delay value of each of the plurality of delayed clock signals. A scan control logic is coupled to the variable delay clock circuit for controlling an operational mode of the variable delay clock circuit. A plurality of latches having a clock input and a data input are coupled to the variable delay clock circuit. Each latch receives a respective one of the generated plurality of delayed clock signals and a data input signal is applied to the data input of a first one of the plurality of latches. The plurality of latches are connected in a chain with a respective latch output connected to a data input of a next latch and a last latch output of the plurality of latches provides an output data signal.

BRIEF DESCRIPTION OF THE DRAWINGS

The present invention together with the above and other objects and advantages may best be understood from the following detailed description of the preferred embodiments of the invention illustrated in the drawings, wherein:

FIG. 1A illustrates a prior art latch arrangement;

FIG. 1B is a timing diagram illustrating prior art latch early mode in the prior art latch arrangement of FIG. 1A;

FIG. 9 is a diagram illustrating exemplary clock skew values relative to the vertical axis and exemplary control register values relative to the horizontal used with the single phase clock verification apparatus of FIG. 2.

DETAILED DESCRIPTION OF THE PREFERRED EMBODIMENTS

Figure 2:
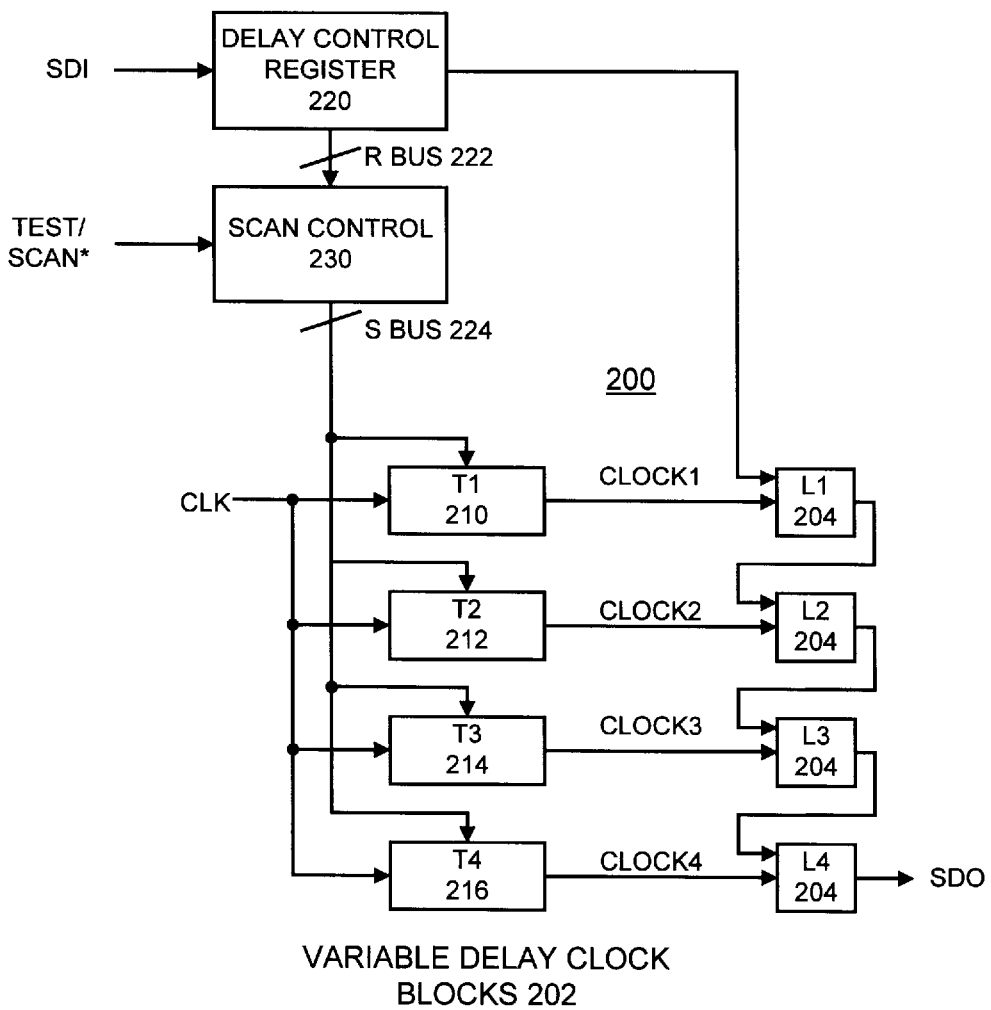
FIG. 2 is a schematic diagram representation of a single phase clock verification apparatus for verifying an on-chip single phase clocking system including testing for latch early mode in accordance with the invention.

Having reference now to the drawings, in FIG. 2 there is shown a single phase clock verification apparatus generally for verifying an on-chip single phase clocking system including testing for latch early mode in accordance with the invention generally designated by the reference character 200. Single phase clock verification apparatus 200 includes a plurality of variable delay clock blocks 202 respectively coupled to a plurality of latches 204. As shown in FIG. 2, the variable delay clock blocks 202 include a variable delay clock block T1, 210 providing at its output a clock signal CLOCK1, a variable delay clock block T2, 212 providing at its output a clock signal CLOCK2, a variable delay clock block T3, 214 providing at its output a clock signal CLOCK3 and a variable delay clock block T4, 216 providing at its output a clock signal CLOCK4.

In accordance with features of the invention, apparatus 200 allows a single phase clock system design to be verified in hardware and allows characterization of latch behavior with respect to early mode failures. Apparatus 200 is very efficient in hardware, requiring minimal capabilities on the part of a tester to characterize, it greatly reduces the resources required to design and analyze. In addition, apparatus 200 advantageously is included as part of a chip design or physically near the design, for example, in a scribe-line test structure and be used as a monitor to screen for a single phase clock system design exhibiting, or marginally close to exhibiting, early mode failures.

In accordance with features of the invention, apparatus 200 uses hardware models 306 (FIG. 3) of the clock distribution network being characterized and the actual design of the latches 204 which are being characterized. The clock distribution models 306 represent the electrical extremes including capacitance and resistance of an expected design. This is necessary to expose the latches 204 to the extremes they will experience in the actual hardware, particularly the arrival times, transition times, and noise.

The latches 204 (L1, L2, L3, and L4) are either single phase latches or latch pairs (flip-flops). Each latch 204 has a first latch input or data input and a second latch input or a respective clock input. A scan data input (SDI) is applied to a first latch L1, 204. The multiple latches 204 are connected in a chain and the output of the last latch L4 is the data output or scan data out (SDO). The signals labeled CLOCK1, CLOCK2, CLOCK3, CLOCK4 represent connections from a single phase clock to the respective latches 204, L1, L2, L3, and L4. The blocks 210, 212, 214, and 216 labeled T1, T2, T3, T4, representing variable delay clock circuits 202 are illustrated and described in more detail with respect to FIG. 3.

A delay control register 220 of N bits is used to control the delay generated by the multiple variable delay clock circuits T1, T2, T3, T4. A bus R, 222 is a bus of N bits wide, which connects the delay control register 220 to a scan control function 230. The output of scan control function 230 is a bus S, 224 of the same width (N bits wide) as bus R, 222. Bus S, 224 connects the scan control function 230 to the variable delay clock circuits T1, T2, T3, T4. It should be understood that each variable delay clock circuit (T1, T2, T3, T4) 210, 212, 214, and 216 is controlled by only some of the n programming bits or a subset of available bits from bus R, allowing separate control of the respective delays for the multiple variable delay clock circuits T1, T2, T3, T4.

The scan control logic 230 performs a simple yet important operational mode control function. During a scan operational mode, it is necessary to eliminate any skew that is intentionally introduced by the variable delay clock blocks 202. Otherwise, the initial state of the latches 204 could not be set using scan patterns. Therefore, the scan control logic 230 detects when scan is active or TEST/SCAN* is low and overrides the effect of the delay control register 220 on the variable delay clock blocks 202. It should be understood that the invention is not limited to the few latches 204 shown in the example of FIG. 2 and could be expanded to a different number of latches as may be practical. Otherwise when the scan control logic 230 detects when scan is not active or TEST/SCAN* is high for the test operational mode, the scan control logic 230 couples a delay control value from the delay control register 220 to the variable delay clock blocks 202 to operatively control the multiple delayed clock signals.

Figure 3:
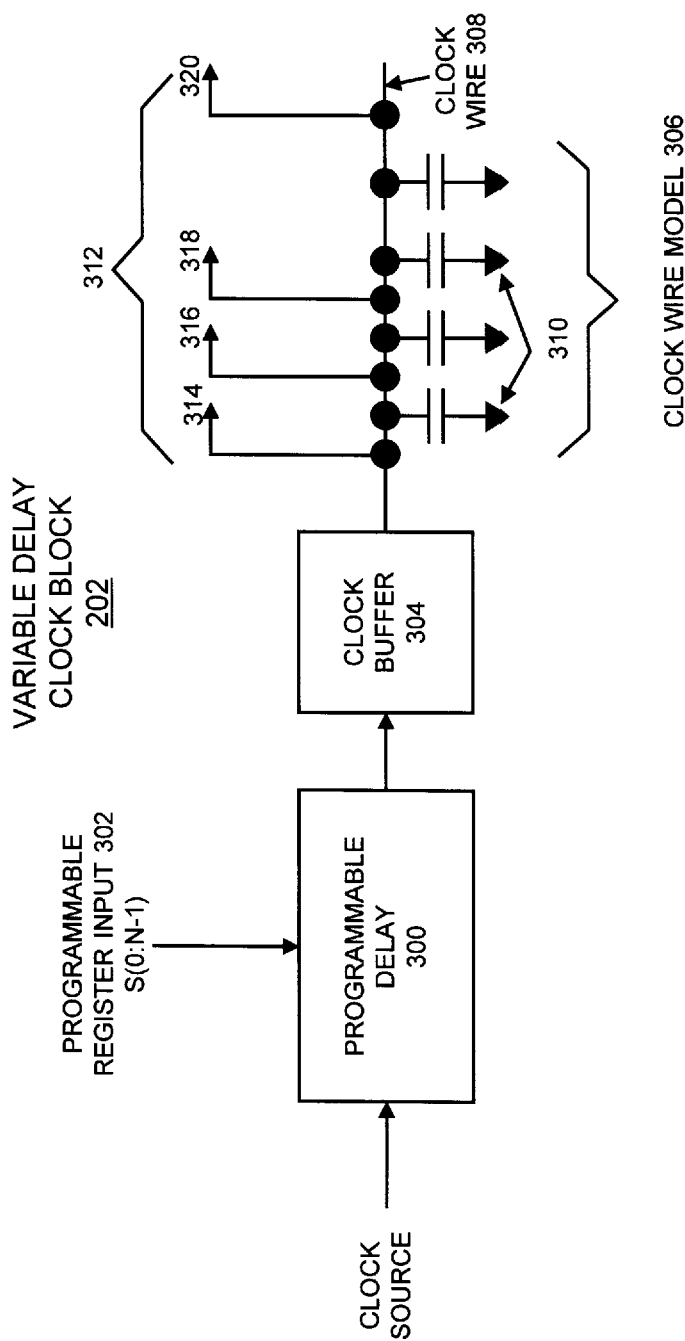
FIG. 3 is a schematic diagram representation of a variable delay clock block of the single phase clock verification apparatus of FIG. 2.

Referring now to FIG. 3, an exemplary arrangement is shown of the variable delay clock blocks 202. Each of the variable delay clock blocks 202 includes three major parts; a programmable delay block 300 receiving a programmable register input 302, a clock buffer 304, and a clock wire model 306. The programmable delay block 300 is illustrated and described with respect to FIG. 4.

The clock buffer 304 represents the actual circuit used on-chip to generate the single phase clock signal. Normally clock buffer 304 will be a portion of the entire on-chip buffer. The clock buffer 304 advantageously is arranged to accurately portray the circuits which actually drive the clock wires 308. It should be understood that multiple different clock buffers can be provided for the clock buffer 304 with each representing a variation on the normal buffer 304, for example used to model possible design changes or to model defective buffers.

The clock wire model 306 is arranged according to the design of the single phase clock distribution being modeled. The clock wire model 306 generally mimics the physical and electrical design of a clock wire 308 used to distribute the single phase clock of the system being verified, and includes loading 310 representative of both self-loading of the wire and expected load due to clock buffers and/or latches and other clocked circuits. Several different clock wire models 306, each representing a particular loading case, are provided to cover all possibilities, or at least the projected extreme cases. Note that an output 312 of the clock wire model 306 (also the output of the variable delay clock block 210, 212, 214, or 216) can be any or several of a plurality of taps 314, 316, 318, and 320 of the clock wire 308. Since it may not be apparent which point on the clock wire 308 exhibits the earliest or latest clock waveform, for example considering the non-linear effects of inductance on the shape of the clock signal and the unknown effect that might have on the delay through latches or clock buffers, it is preferable to have several different cases modeled to cover all possible extremes. For example, two cases might be one in which the output 312 of the variable delay clock block 202 is a connection or tap 314 at a point nearest the input from the clock buffer 304 and another is a connection or tap 320 furthest from the clock buffer 304.

Figure 4:
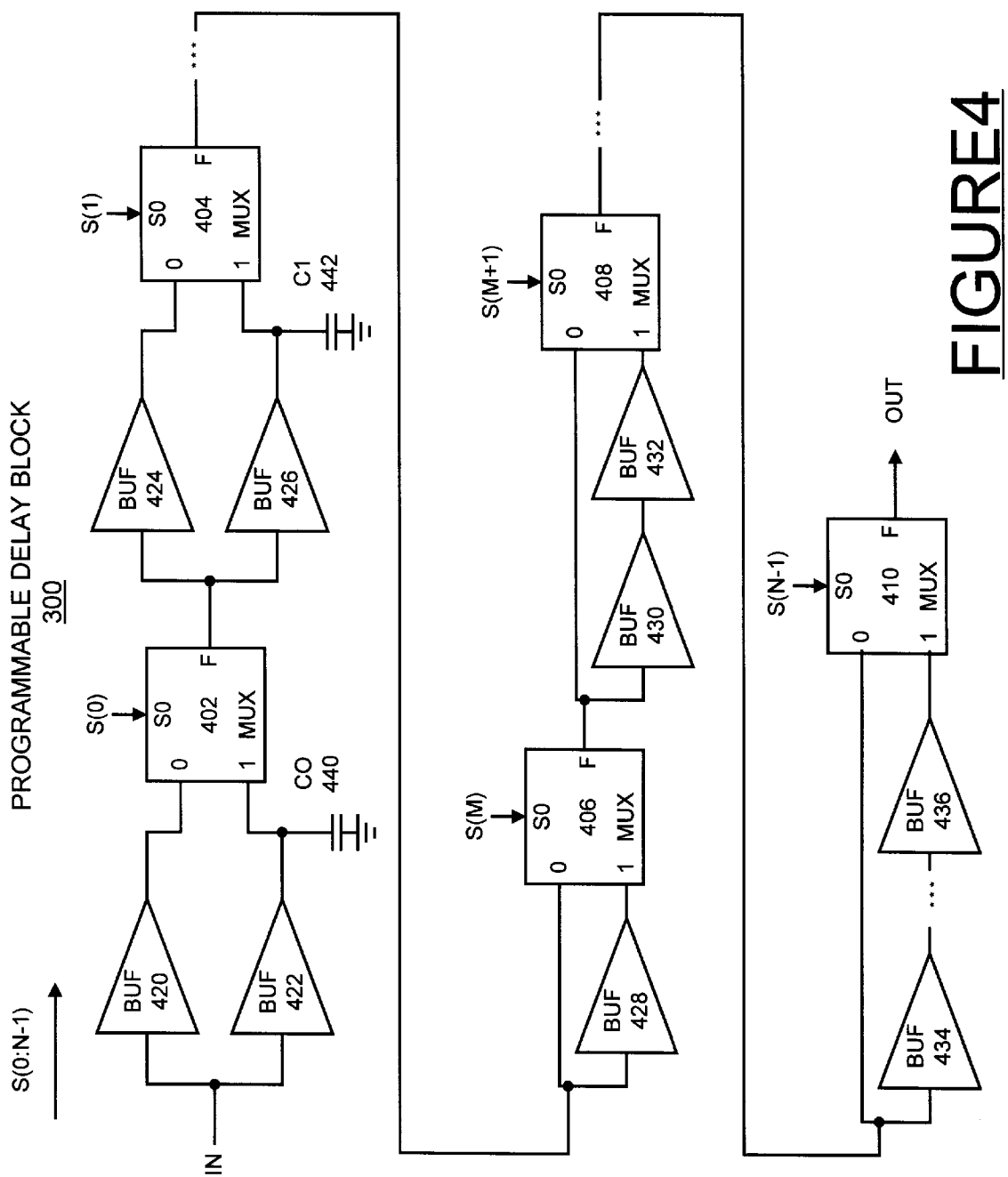
FIG. 4 is a schematic diagram representation of a programmable delay block of the variable delay clock block of FIG. 2.

Referring to FIG. 4, the exemplary programmable delay block 300 includes a plurality of multiplexers (MUX) 402, 404, 406, 408, 410, a plurality of buffers 420, 422, 424, 426, 428, 430, 432, 434, 436 and a pair of capacitors (C0, C1), 440, 442. A simple series connection of the buffers 420, 422, 424, 426, 428, 430, 432, 434, 436 and multiplexers 402, 404, 406, 408, 410 is used to control the delay from an input IN to the output OUT. The control input from the delay control register 220 on the selection control bus S, 224 of N bits S(0:N−1) operatively determines the delay of the programmable delay block 300. If all N bits S(0:N−1) are low, then a minimum delay is obtained since all the multiplexers 402, 404, 406, 408, 410 select the 0 input which comes directly from the respective previous multiplexer 404, 406 and 408 for multiplexers 406, 408 and 410, and from the respective previous buffer 420 and 424 for the first M multiplexers 402 and 404 providing a buffer delay per stage. If, for example, S(0) is high, then the first multiplexer 402 selects the 1 input which is slightly longer from IN since the buffer 422 has the added load capacitor C0, 440 on its output. The amount of capacitance represented by capacitor C0, 440 is selected by the designer and is based for example, in CMOS technology, on the relative sizes of the devices in the buffer 422 and the multiplexer 402, the capacitance of wires interconnecting the buffers and multiplexers, and the resolution desired. An example would be to select a value for capacitor C0, 440 to increase the delay through the buffer 422 by about 25% of its delay without the capacitor C0. Similarly, if S(1) is high the second multiplexer 404 selects the path through the buffer 426 loaded with capacitor C1, 442 rather than the unloaded path through buffer 424. The selection of a value for capacitor C1, 442 is typically chosen to be such that the delay through the buffer 426 is increased by the same out over the buffer loaded by C0 as was the buffer loaded by C0 over an unloaded buffer. For example, capacitor C1, 442 could be chosen to increase the delay through the buffer 426 by 50% over the unloaded buffer 424. Any number of such buffer and multiplexer combinations could be linked in series with additional capacitor values (C3, C4, etc.) providing varying delays and the desired resolution.

By selecting multiple ones of the multiplexers 402, 404, 406, 408, 410, multiple different combinations of delays can be used to add various amounts of delay. For example, if both S(1) and S(0) are high, then the delay through the first two stages of multiplexers 404 and 404 would be 75% of one buffer delay more than if S(1) and S(0) were both low.

It should be understood that the number of stages built in this manner of the first M stages of multiplexers 404 and 404 is not limited. By careful selection of capacitance values (C0, C1, C2, C3) any number of stages could be added to obtain whatever resolution in programming the delay desired. Normally the variation in the physical implementation of the separate buffers, and the uncontrollable variations or differences in the delay through identical circuits due to on-chip processing variations, will limit the resolution of that may be obtained. However, careful circuit design and layout can reduce these variations to a minimum.

The last stages 406, 408, and 410 of the programmable delay block 300 have a different design. Rather than rely solely on loading variations to select between multiple paths and thus control the delay from IN to OUT, the stages of multiplexers 408 and 410 after the first M stages introduce additional gate delays in the delay path with the series buffers 430 and 432, and/or 434 and 436, with either or both S(M+1) and S(N−1) set high, or no gate delays with the select signals S(M), S(M+1) and S(N−1) set low.

For example, if S(M) is low then the delay through the multiplexer 406 controlled by S(M) will be just the delay of the multiplexer itself. If S(M) is high, then an additional buffer delay is added by the buffer 428. If S(M) is low and S(M+1) is high, two buffer delays are added by the buffers 430 and 432 connected in series to the 1 input of multiplexer 408. If both S(M) and S(M+1) are high, then three buffer delays are added. Typically the number of buffers added is increased in a geometric progression, such as 1, 2, 4, 8, 16, etc., while this is not required.

Typically the latency, or minimum delay, through the programmable delay 300 is not a major concern. During the scan operational mode, the delays of all the variable delay blocks 202 are set to the same value to prevent early mode between latches 204 in the scan chains. A similar delay may be required between the CLK source and the latches in the delay control register 220 to prevent early mode between the delay control register 220 and the test latches 204 in the scan chain. Alternately, early mode padding could be introduced in between the delay control register latches and the test latches 204, or the input of the first latch in the delay control register 220 could be connected to the output of the last test latch 204.

Figure 5:
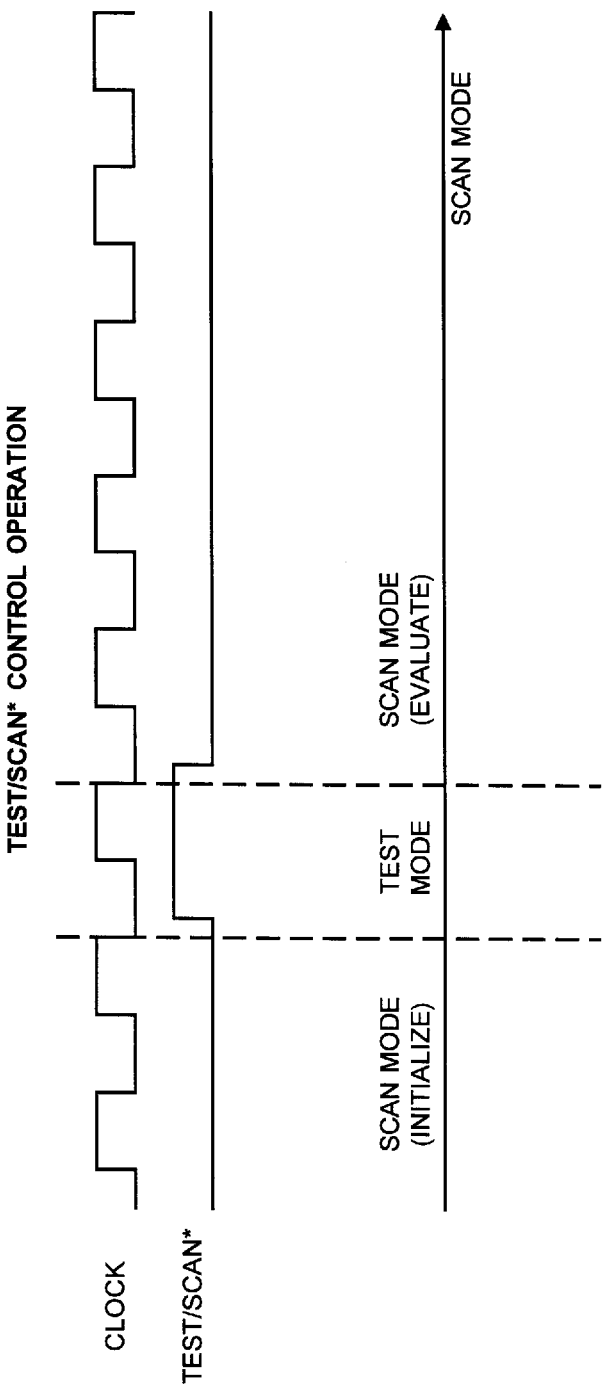
FIG. 5 is a timing diagram illustrating a test mode and a scan mode of the single phase clock verification apparatus of FIG. 2.

Referring to FIG. 5, the clock verification apparatus 200 operates in two operational modes including the scan operational mode and the test operational mode. The scan operational mode is used to initialize the circuit 200. The test operational mode is used to verify whether the latches 204 fail or not due to early mode. The scan operational mode is also used to observe the results of the operation of the previous test operational mode.

In the scan operational mode, the TEST/SCAN* is low and the CLK is pulsed multiple times. The scan control logic 230 forces the bus R, 222 to a state which causes all of the variable delay clock blocks 202 to have approximately the same delay. As the clock (CLK toggles, data is applied to the circuit 200 through the SDI input to the delay control register 220. The applied data depends on the desired initial state of the test latches 204 and the setting of the bits in the delay control register 220. Typically the test latches 204 are initialized so that the data alternates state through the chain so that an early mode failure will result in a latch capturing data which is the opposite state of that intended and the failure can then be detected. The delay control register 220 is programmed with the combination of states that selects the desired amount of clock delay for each variable delay clock block 202.

In the test operational mode, TEST/SCAN* initially is held low and the CLK is cycled one time. The scan control logic 230 simply passes the value of bus R, 222 from the delay control register 220 to the various variable delay clock blocks 202. The delay through the delay clock blocks 202 depends upon the settings in the delay control register 220, so the clock going to the various latches is delayed various amounts.

After the test operational mode, the scan operational mode is also used to off-load data. Each bit of the scan data chain is compared to a good data sequence simulation. Any miscomparison indicates that the latch 204 in that bit position failed due to early mode during the test operational mode. By successively utilizing various settings of the delay control register 220 in sequential test operational modes, the precise setting of the register which causes each particular latch 204 to fail due to early mode can be determined. This register setting can then be correlated to a simulation and/or be compared to measurements made in actual hardware.

Figure 6:
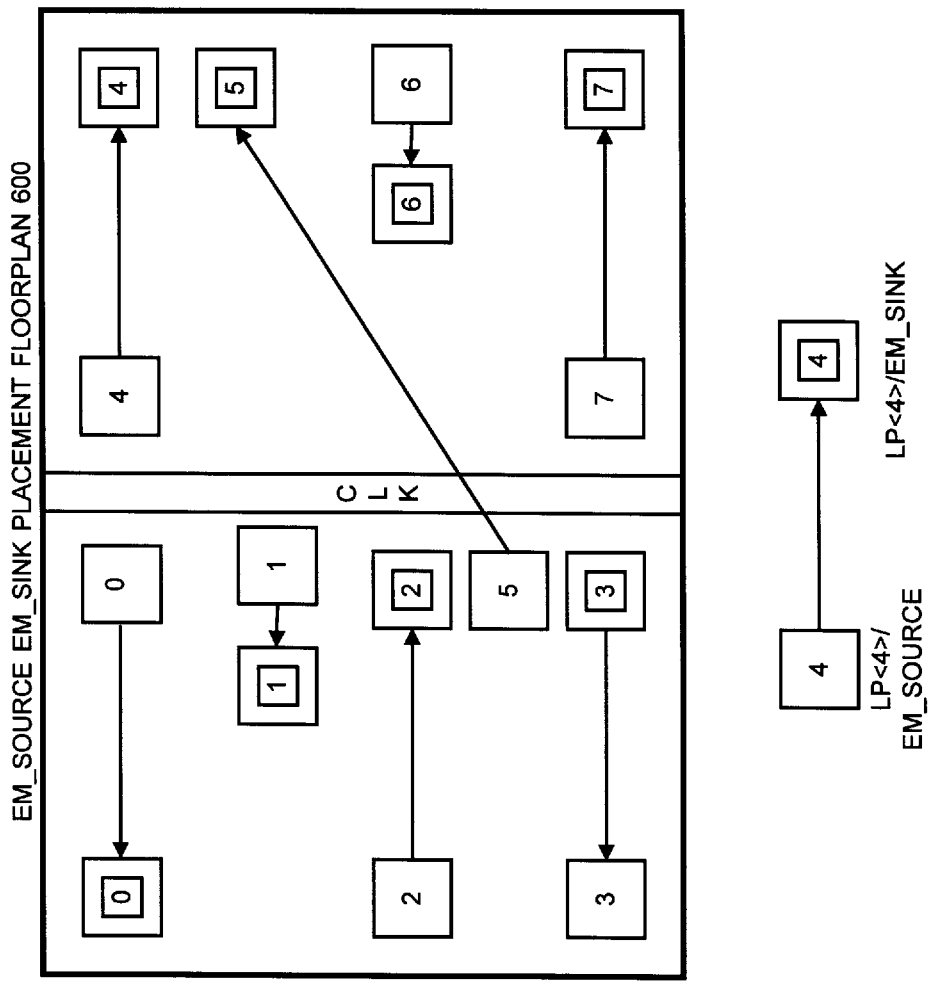
FIG. 6 illustrates an exemplary source, sink placement floorplan used with the single phase clock verification apparatus of FIG. 2.

FIG. 6 illustrates an exemplary source, sink placement floorplan 600 used with the single phase clock verification apparatus 200 with an on-chip single phase clock CLK generally central portion of the metal grid 12 along the height of chip floorplan 600.

Figure 7:
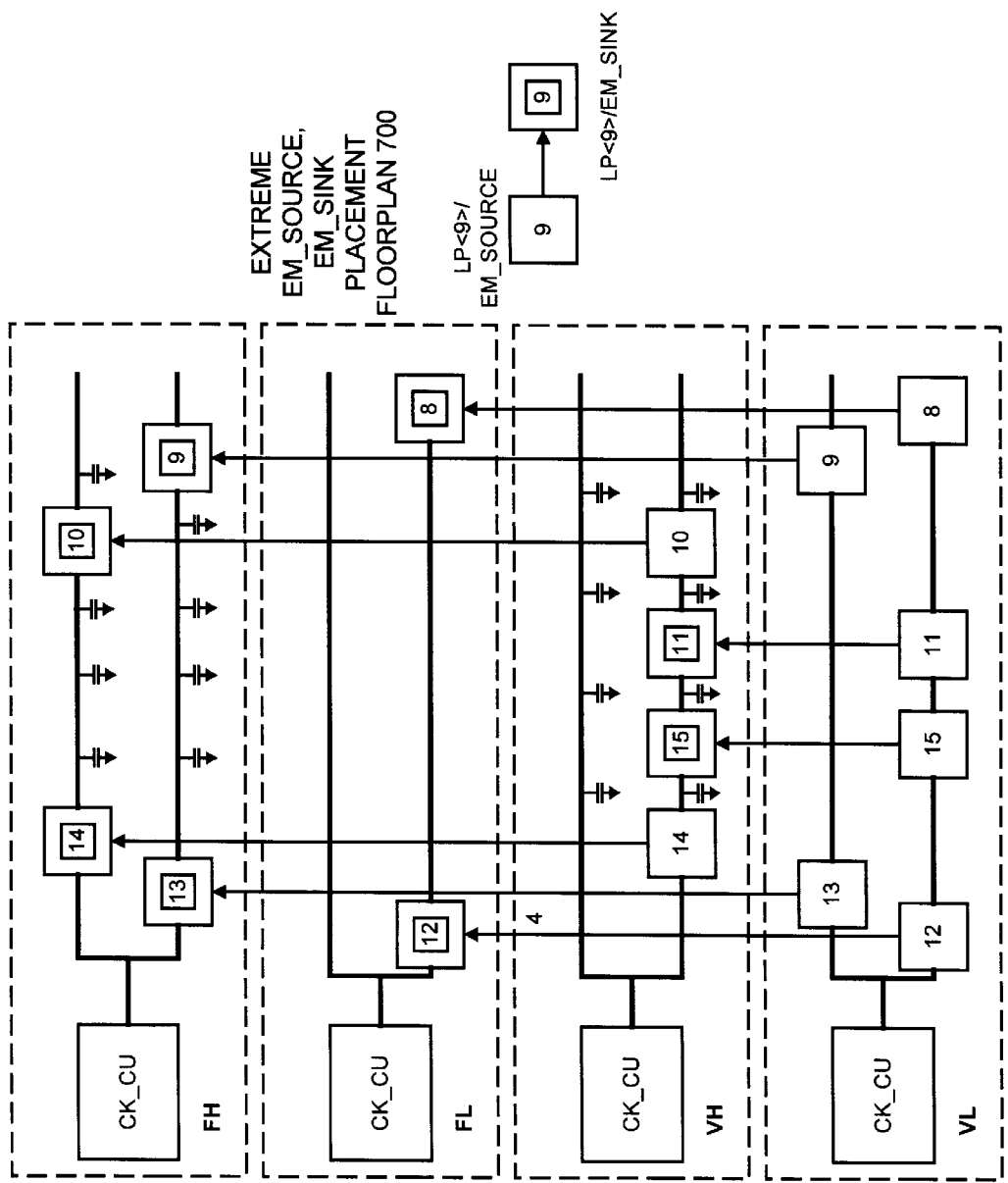
FIG. 7 illustrates another exemplary extreme source, sink placement floorplan used with the single phase clock verification apparatus of FIG. 2.

FIG. 7 illustrates another exemplary extreme source, sink placement floorplan 700 used with the single phase clock verification apparatus 200. FIG. 7 illustrates multiple wiring models with respective clock buffers CK_CU labeled FH, FL, VL, and VL, where F represents fixed arrival time, H represents heavily loaded grid fragment, V represents variable arrival time and L represents lightly loaded grid fragment.

Figure 8:
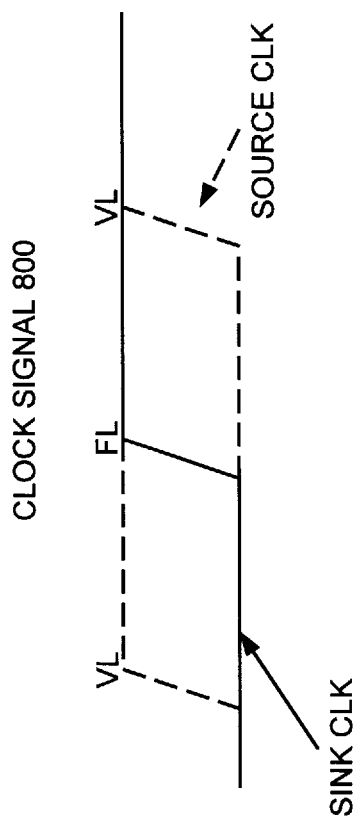
FIG. 8 illustrates exemplary clock signals used with the single phase clock verification apparatus of FIG. 2.

FIG. 8 illustrates an exemplary clock signals of source and sink clock used with the single phase clock verification apparatus 200.

FIG. 9 illustrates exemplary clock skew values relative to the vertical axis and exemplary control register values relative to the horizontal used with the single phase clock verification apparatus 200. The illustrated clock skew values are referenced to a lightly loaded fixed clock. The equation for the illustrated skew line is approximately SKEW ~0.02*N−1, where N is the decimal value programmed by the delay control register 220.

While the present invention has been described with reference to the details of the embodiments of the invention shown in the drawing, these details are not intended to limit the scope of the invention as claimed in the appended claims.

What is claimed is:

1. An apparatus for verifying an on-chip single phase clocking system comprising:

variable delay clock means for generating a plurality of delayed clock signals;

delay control register means selectively coupled to said variable delay clock means for operatively controlling a delay value of each of said plurality of delayed clock signals;

scan control means coupled to said variable delay clock means for controlling a plurality of operational modes of said variable delay clock means; and a plurality of latches having a clock input and a data input coupled to said variable delay clock means, each latch receiving a respective one of said generated plurality of delayed clock signals; a data input signal being applied to said data input of a first one of said plurality of latches, said plurality of latches being connected in a chain with a respective latch output connected to a data input of a next latch and a last latch output of said chain of latches providing an output data signal.

2. An apparatus for verifying an on-chip single phase clocking system as recited in claim 1 wherein said plurality of operational modes of said variable delay clock means include a scan operational mode and a test operational mode, said scan operational mode is used to initialize said variable delay clock means before said test operational mode and to obtain test results after said test operational mode.

3. An apparatus for verifying an on-chip single phase clocking system as recited in claim 2 wherein said test operational mode is used to coupling said delay control register means to said variable delay clock means.

4. An apparatus for verifying an on-chip single phase clocking system as recited in claim 1 wherein said variable delay clock means includes a programmable delay circuit coupled to a clock buffer and at least one clock wire model connected to said clock buffer.

5. An apparatus for verifying an on-chip single phase clocking system as recited in claim 4 wherein said programmable delay circuit includes a series connection of a plurality of multiplexers and a plurality of buffers.

6. An apparatus for verifying an on-chip single phase clocking system as recited in claim 5 further includes at least one capacitor connected between one of said buffers and an input to one of said plurality of multiplexers.

7. An apparatus for verifying an on-chip single phase clocking system as recited in claim 5 wherein said delay control register means is coupled to a select input of said plurality of multiplexers.

8. An apparatus for verifying an on-chip single phase clocking system as recited in claim 5 wherein multiple ones of said buffers are connected in series to an input to selected ones of said plurality of multiplexers.

9. An apparatus for verifying an on-chip single phase clocking system as recited in claim 5 wherein one of said buffers is connected in series to a first input to selected ones of said plurality of multiplexers.

10. A method for verifying an on-chip single phase clocking system with a clocking system verification apparatus including a plurality of variable delay clock blocks, a delay control register, a scan control logic and a plurality of latches having a clock input and a data input, said plurality of latches being connected in a chain with a respective latch output connected to a data input of a next latch and a last latch output of said chain of latches providing an output data signal and a data input signal being applied to said data input of a first one of said plurality of latches, said method comprising the steps of:

generating a plurality of delayed clock signals utilizing said plurality of variable delay clock blocks;

operatively controlling a delay value of each of said plurality of delayed clock signals utilizing said delay control register for applying control values to said plurality of variable delay clock blocks;

controlling scan and test operational modes of said plurality of variable delay clock blocks utilizing said scan control logic for selectively connecting said delay control register to said plurality of variable delay clock blocks; and applying a respective one of said generated plurality of delayed clock signals to each latch of said plurality of latches.

11. A method for verifying an on-chip single phase clocking system as recited in claim 10 wherein the steps of controlling scan and test operational modes of said plurality of variable delay clock blocks utilizing said scan control logic includes the steps of providing said scan operational mode for initializing said plurality of variable delay clock blocks, providing said test operational mode for applying delay control values from said delay control register to said plurality of variable delay clock blocks, and providing said scan operational mode for obtaining said output data signal from said last latch output of said chain of latches following said test operational mode.

* * * * *